(12) United States Patent
Ahn et al.

(10) Patent No.: US 11,437,196 B2
(45) Date of Patent: Sep. 6, 2022

(54) MULTILAYER CERAMIC SUBSTRATE AND PROBE CARD INCLUDING SAME

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 323 days.

(21) Appl. No.: 16/776,134

(22) Filed: Jan. 29, 2020

(65) Prior Publication Data

US 2020/0251284 A1 Aug. 6, 2020

(30) Foreign Application Priority Data

Jan. 31, 2019 (KR) .......................... 10-2019-0013083

(51) Int. Cl.
*H01G 4/40* (2006.01)
*H01G 4/12* (2006.01)

(52) U.S. Cl.
CPC ................. *H01G 4/40* (2013.01); *H01G 4/12* (2013.01)

(58) Field of Classification Search
None
See application file for complete search history.

(56) References Cited

U.S. PATENT DOCUMENTS

| 6,436,802 B1 * | 8/2002 | Khoury ..................... G01R 3/00 257/E23.021 |
| 6,535,398 B1 * | 3/2003 | Moresco ................. H05K 1/185 257/E23.079 |
| 10,499,506 B2 * | 12/2019 | Hanao ........................ B32B 5/30 |
| 2003/0192176 A1 * | 10/2003 | Eldridge .................... B81B 7/04 361/764 |
| 2009/0321114 A1 * | 12/2009 | Takahashi ............ H05K 3/4629 156/89.12 |
| 2010/0252317 A1 * | 10/2010 | Gritters ............... H01L 25/0657 29/875 |
| 2011/0024167 A1 * | 2/2011 | Hashimoto .......... H05K 3/4688 29/846 |
| 2012/0119370 A1 * | 5/2012 | Yoo ................... H01L 23/49827 257/773 |
| 2014/0139250 A1 * | 5/2014 | Yaglioglu .............. B82Y 30/00 977/742 |
| 2014/0239852 A1 * | 8/2014 | Kim ....................... H05B 47/19 315/312 |

(Continued)

FOREIGN PATENT DOCUMENTS

| CN | 105097760 A | * 11/2015 | ............. H01L 21/48 |
| CN | 106029955 A | * 10/2016 | ............. B32B 15/01 |

(Continued)

*Primary Examiner* — Timothy J. Dole
*Assistant Examiner* — Muhammed Azam

(57) ABSTRACT

A multilayer ceramic substrate includes a first insulating portion including a body of a ceramic material, a first via conductor penetrating through the body, and a first internal wiring layer and a first connection pad connected to the first via conductor, and a second insulating portion including a body of an anodized oxide material, a second via conductor penetrating through the body, and a second internal wiring layer and a second connection pad connected to the second via conductor.

6 Claims, 5 Drawing Sheets

(56) References Cited

U.S. PATENT DOCUMENTS

| | | | |
|---|---|---|---|
| 2015/0008951 A1* | 1/2015 | Otsubo | H05K 1/0268 156/89.12 |
| 2016/0064146 A1* | 3/2016 | Ahn | H01G 4/38 361/301.4 |
| 2018/0275169 A1* | 9/2018 | Jacobs | G01R 31/2886 |
| 2020/0251284 A1* | 8/2020 | Ahn | H01G 4/12 |
| 2021/0136927 A1* | 5/2021 | Ahn | H05K 1/036 |
| 2021/0302471 A1* | 9/2021 | Ahn | G01R 1/06794 |

FOREIGN PATENT DOCUMENTS

| | | | | |
|---|---|---|---|---|
| CN | 111610353 A | * | 9/2020 | G01R 1/0491 |
| CN | 112689399 A | * | 4/2021 | G01R 1/07342 |
| CN | 112788867 A | * | 5/2021 | G01R 1/07307 |
| CN | 113203881 A | * | 8/2021 | G01R 1/07314 |
| CN | 113447683 A | * | 9/2021 | G01R 1/07378 |
| JP | 2003158239 A | * | 5/2003 | H01L 21/6835 |
| JP | 2004259714 A | * | 9/2004 | |
| JP | 2006186238 A | * | 7/2006 | H01L 23/49822 |
| JP | 2012047579 A | * | 3/2012 | |
| JP | 2014239084 A | * | 12/2014 | H01L 23/13 |
| JP | 2016072285 A | | 5/2016 | |
| KR | 20080097065 A | * | 11/2008 | |
| KR | 100964568 B1 | * | 6/2010 | |
| KR | 101067091 B1 | * | 9/2011 | |
| KR | 101384399 B1 | * | 4/2014 | |
| KR | 20170139321 A | * | 12/2017 | |
| KR | 102095208 B1 | * | 3/2020 | |
| KR | 20200063009 A | * | 6/2020 | |
| KR | 20200090564 A | * | 7/2020 | |
| KR | 20210054215 A | * | 5/2021 | |
| KR | 20210082661 A | * | 7/2021 | |
| KR | 20210100373 A | * | 8/2021 | |
| KR | 20210121555 A | * | 10/2021 | |
| KR | 20210130458 A | * | 11/2021 | |
| KR | 102385660 B1 | * | 4/2022 | |
| WO | WO-03063237 A1 | * | 7/2003 | H01L 23/145 |
| WO | WO-2012043658 A1 | * | 4/2012 | C04B 33/00 |
| WO | WO-2015151809 A1 | * | 10/2015 | |
| WO | WO-2021194213 A1 | * | 9/2021 | G01R 1/07342 |

* cited by examiner

MULTILAYER CERAMIC SUBSTRATE AND PROBE CARD INCLUDING SAME

CROSS REFERENCE TO RELATED APPLICATION

The present application claims priority to Korean Patent Application No. 10-2019-0013083, filed Jan. 31, 2019, the entire contents of which is incorporated herein for all purposes by this reference.

BACKGROUND OF THE INVENTION

Field of the Invention

The present invention relates to a multilayer ceramic substrate and a probe card including the same and, more particularly, to a multilayer ceramic substrate having a low thermal expansion coefficient and a high electrical conductivity.

Description of the Related Art

In general, the semiconductor fabrication process is performed through a fabrication process of forming a pattern on a wafer, an electrical die sorting (EDS) process of examining electrical characteristics of each chip constituting the wafer, and an assembly process of assembling the patterned wafer into each chip.

Here, the EDS process is performed to determine defective chips among the chips constituting the wafer. In the EDS process, a probe card is mainly used to apply an electrical signal to the chips constituting the wafer and determine a failure on the basis of a signal checked from the applied electrical signal.

The probe card includes probe pins that contact the pattern of each chip constituting the wafer to apply an electrical signal, a space transformer (ST) to perform pitch transform between the probe pin and a PCB board, and an interposer to connect the space transformer to the PCB board The space transformer used for the probe card is mainly provided with a multilayer ceramic (MLC) substrate including a plurality of ceramic substrates. The multilayer ceramic substrate has an advantage that has a low thermal expansion coefficient and thus is not affected by heat generated from the wafer to be measured. However, the multilayer ceramic substrate has a disadvantage in that the wiring is made of tungsten having a lower electrical conductivity than metals such as copper and gold to withstand the ceramic sintering temperature.

Recently, in order to make up for this drawback, the multilayer wiring board formed of a plurality of materials has been developed, and as a patent for such a multilayer wiring board, that disclosed in Japanese Patent Application Publication No. 2016-72285 (hereinafter referred to as "related art") is known.

The multilayer wiring board in the related art includes a ceramic substrate and a plurality of resin layers of polyimide material. The multilayer wiring board in the related art uses a ceramic substrate having a low coefficient of thermal expansion and simultaneously includes a wiring formed of copper in a resin layer made of polyimide, thereby having an effect of having a low thermal expansion coefficient and high electrical conductivity.

However, in the relate art, the polyimide resin layer having a high thermal expansion coefficient is provided at a position relatively closer to the wafer to be inspected. Accordingly, there are problems that thermal deformation may occur in the polyimide resin layer and thus the accuracy of inspection is decreased.

DOCUMENTS OF RELATED ART (Patent Document 1) Japanese Patent Application Publication No. 2016-0072285

SUMMARY OF THE INVENTION

The present invention has been conceived to solve the above-mentioned problems, and it is an objective of the present invention to provide a multilayer ceramic substrate having a low thermal expansion coefficient and a high electrical conductivity.

In addition, it is an objective of the present invention is to securely fix a multilayer insulation portion since an insulation portion of am anodic oxide film including a plurality of pores is provided so that the solder penetrates into the pores and then hardens.

In order to achieve the above objective, a multilayer ceramic substrate according to the present invention includes a first insulating portion including a body of a ceramic material, a first via conductor penetrating through the body, and a first internal wiring layer and a first connection pad connected to the first via conductor; and a second insulating portion including a body of an anodized oxide material, a second via conductor penetrating through the body, and a second internal wiring layer and a second connection pad connected to the second via conductor.

In addition, the first via conductor, the first internal wiring layer, and the first connection pad may be provided in tungsten; and the second via conductor, the second internal wiring layer, and the second connection pad may be provided in copper.

In addition, the second insulating portion may further include a solder bump at one end of each of the second internal wiring layer and the second connection pad provided in a plurality of layers; and the second via conductor, the second internal wiring layer, and the second connection pad provided in the respective layers may be connected to each other through the solder bump.

In addition, the second insulating portion may include a plurality of pores formed during anodization, and a portion of the solder bump is melted to be penetrated into the pore and then hardens to fix the second via conductor, the second internal wiring layer, and the second connection pad on the second insulating portion.

In addition, the second insulating portion may further include a blocking portion on one side in which the layers are overlapped with each other; and the blocking portion may be provided at both sides of the solder bump.

In addition, the blocking portion may be provided as an adhesive insulating material.

A probe card according to the present invention includes a first insulating portion including a body of a ceramic material, a first via conductor penetrating through the body, and a first internal wiring layer and a first connection pad connected to the first via conductor; a second insulating portion including a body of an anodized oxide material, a second via conductor penetrating through the body, and a second internal wiring layer and a second connection pad connected to the second via conductor; and a probe pin attached to the second connection pad of the second insulating portion.

As described above, a multilayer ceramic substrate according to the present invention can have a low thermal expansion coefficient and a high electrical conductivity.

In addition, it is possible to securely fix the multilayer insulation portion, since the insulation portion of the anodic oxide film including a plurality of pores is provided so that the solder penetrates into the pores and then hardens.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

The following merely illustrates the principles of the invention. Therefore, those skilled in the art can implement the principles of the invention and invent various devices included in the concept and scope of the invention, although not explicitly described or illustrated herein. In addition, all conditional terms and embodiments listed herein are in principle clearly intended for the purpose of understanding the concept of the invention and should be understood not to be limited to the specifically listed embodiments and states.

The above objects, features, and advantages will become more apparent from the following detailed description taken in conjunction with the accompanying drawings, whereby the technical spirit of the invention may be easily implemented by those skilled in the art.

Hereinafter, preferred embodiments of the present invention will be described in detail with reference to the accompanying drawings.

Figure 1:
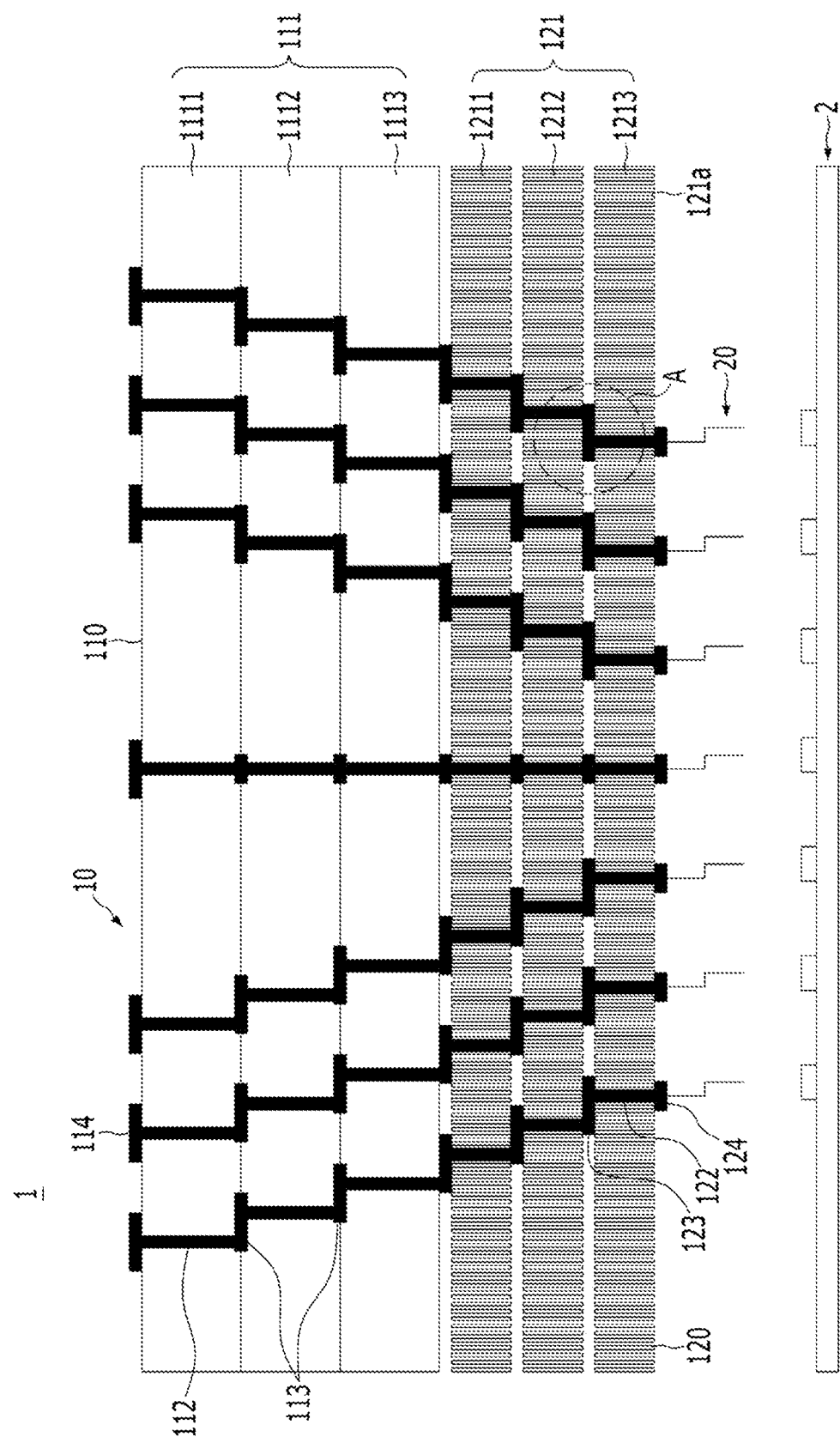
FIG. 1 is a view schematically showing a probe card according to a preferred embodiment of the present invention.
Figure 2:
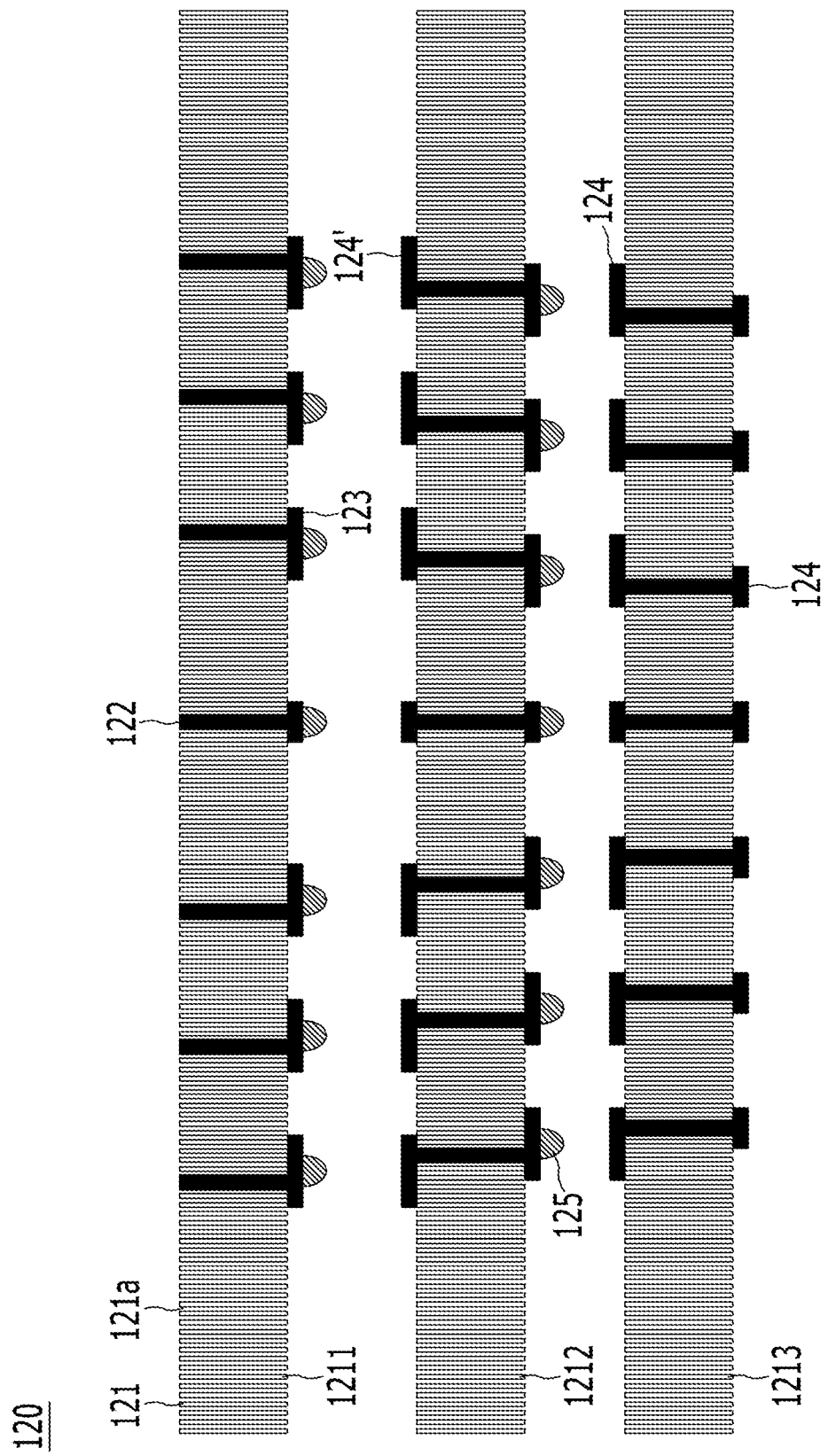
FIG. 2 is a view showing a second insulating portion of the probe card of FIG. 1.
Figure 3:
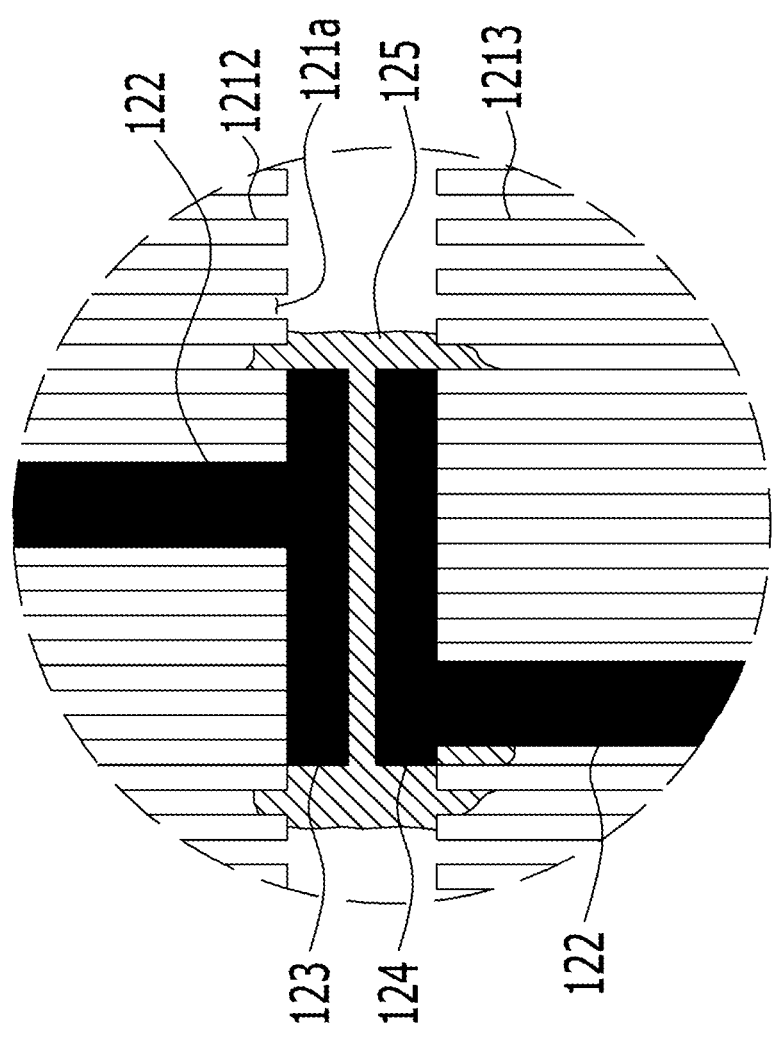
FIG. 3 is an enlarged view illustrating a portion A of FIG. 1.

FIG. 1 is a view schematically showing a probe card according to a preferred embodiment of the present invention, FIG. 2 is a view showing a second insulating portion of the probe card of FIG. 1, and FIG. 3 is an enlarged view illustrating a portion A of FIG. 1.

Referring to FIGS. 1 to 3, a probe card 1 checks a state such as a disconnection or a short circuit, and includes a multilayer ceramic substrate 10 and a probe pin 20. Specifically, the probe card 1 is positioned above a wafer 2 on which a circuit to be inspected is formed, and is connected to a variety of external equipment to move up and down with respect to the wafer 2, thereby checking whether a normal circuit is formed. In FIG. 1, it is shown that the probe card 1 moves up with respect to the wafer 2.

The multilayer ceramic substrate 10 is provided between a PCB substrate (not shown) and the probe pin 20, and compensates for a difference between the substrate terminal of the PCB substrate and the pitch of the probe pin 20. In detail, the multilayer ceramic substrate 10 includes a first insulating portion 110 and a second insulating portion 120.

The first insulating portion 110 is connected to the PCB substrate or an interposer (not shown), and includes a first body 111 made of ceramic material, a first via conductor 112 penetrating through the first body 111, and a first internal wiring layer 113 and a first connection pad 114 connected to the first via conductor 112.

The first insulating portion 110 includes a plurality of first bodies 111. In detail, the first body 111 includes a plurality of layers, and each layer includes the first via conductor 112, the first internal wiring layer 113, and the first connection pad 114. According to the present embodiment, it is illustrated that the first body 111 is provided with three layers as an example, but the spirit of the present invention is not limited thereto.

The first body 111 is provided with a first upper layer 1111, a first intermediate layer 1112, and a first lower layer 1113. The first upper layer 1111 is a layer connected to the PCB substrate, the first lower layer 1113 is a layer connected to the second insulating portion 120, and the first intermediate layer 1112 is a layer provided between the first upper layer 1111 and the first lower layer 1113.

The first body 111 may form a plurality of through holes by laser irradiation, punching, drilling, or the like. Herein, each through hole of the first upper layer 1111 may be formed at a position corresponding to the terminal of the PCB substrate; each through hole of the first intermediate layer 1112 may be formed in such a manner to be located closer to the center than the through hole of the first upper layer 1111; and each through hole of the first lower layer 1113 may be formed in such a manner to be located closer to the center than the through hole of the first intermediate layer 1112.

The through holes of each the layers 1111, 1112, and 1113 of the first body 111 are filled with a conductive material. Tungsten may be used as the conductive material, by which the first via conductor 112 may be formed.

The conductive material may be printed on the top portions of the first intermediate layer 1112 and the first lower layer 1113 through a separate paste printing apparatus. Tungsten may be used as the conductive material, by which the first internal wiring layer 113 may be formed. The first internal wiring layer 1113 connects each of the first via conductors 112 of each of the layers 1111, 1112, and 1113 to each other, and may be formed at a position corresponding to the first via conductor 112. However, the position of the first internal wiring layer 113 is not limited thereto. For example, the first internal wiring layer 113 may be formed on the bottom portion of the first upper layer 1111 and on the bottom portion of the first intermediate layer 1112.

In addition, the conductive material may be printed on the top of the first upper layer 1111 and the bottom of the first lower layer 1113 through the paste printing apparatus. Tungsten may be used as the conductive material, by which the first connection pad 114 may be formed. Herein, the first connection pad 114 of the first upper layer 1111 may be connected to a terminal of the PCB board, and the first connection pad 114 of the first lower layer 1113 may be connected to the second insulating portion 120.

When the first via conductor 112, the first internal wiring layer 113, and the first connection pad 114 are provided, each layer 1111, 1112, and 1113 of the first body 111 may be stacked, and then a pressure is applied thereto. Each of the layers 1111, 1112, and 1113 is baked for a predetermined time at a temperature of 1300 to 1500° C., so that the first body 111 made of ceramic material, and the first via conductor 112, the first internal wiring layer 113, and the first connection pad 114 made of tungsten material may be integrated with each other. That is, the first body 111, the first via conductor 112, the first internal wiring layer 113, and the first connection pad 114 may be formed in an integral manner.

A second insulating portion 120 is provided on the bottom portion of the first insulating portion 110. The second insulating portion 120 is connected to the probe pin 20, and includes a second body 121 made of an anodized oxide material, a second via conductor 122 penetrating through the second body 121, and a second internal wiring layer 123 and a second connection pad 124 connected to the second via conductor 122.

The second insulating portion 120 includes a plurality of second bodies 121. In detail, the second body 121 may include a plurality of layers, and each layer includes a second via conductor 122, a second internal wiring layer 123, and a second connection pad 124. According to the present embodiment, it is illustrated that the second body 121 is provided with three layers as an example, but the spirit of the present invention is not limited thereto.

The anodic oxide film refers to a film formed by anodizing a base metal, and the anodic oxide film forms a plurality of pores 121a which are holes having a regular arrangement during the anodization.

When the base metal is aluminum (Al) or an aluminum alloy, an anodic oxide film made of anodized aluminum ($Al_2O_3$) is formed on the surface of the base material by anodizing the base material. The anodic oxide film thus formed is divided into a barrier layer in which pores 121a are not formed inside, and a porous layer in which pores 121a are formed inside. The barrier layer is located on the top of the base material, and the porous layer is located on the top of the barrier layer.

In the base material on which the anodic oxide film having the barrier layer and the porous layer is formed on the surface, when the base material is removed, only the anodic oxide film made of anodized aluminum ($Al_2O_3$) material remains. Herein, when the barrier layer is removed, the anodic oxide film is made of aluminum anodized ($Al_2O_3$) material and has a thin plate shape, and has pores 121a regularly arranged while having a uniform diameter and penetrating up and down in the vertical direction. In this way, the anode oxide removed up to the barrier layer may be used as the second body 121.

Each pore 121a is present independently of each other in the second body 121. In other words, in the second body 121 made of anodized aluminum ($Al_2O_3$) material, a number of pores 121a having an inner width of several nm to several hundred nm may be formed on the second body 121 is formed to penetrate up and down.

The second body 121 is further provided with a through hole in addition to the pores 121a which are naturally formed while anodizing the metal base material. The through hole is configured to penetrate the second body 121 up and down.

The through hole is formed by etching the second body 121. The second body 121 is partially masked, and only the unmasked area is etched to form the through hole. The second body 121 may be provided so that through holes having an inner width larger than the pore 121a may be formed through etching, and also the through holes may vertically penetrate the second body 121 while the etching solution reacts with the second body 121. As described, both the pore 121a and the through hole are vertically formed side by side in the second body 121

The second body 121 includes a second upper layer 1211, a second intermediate layer 1212, and a second lower layer 1213. The second upper layer 1211 is a layer connected to the first insulating portion 110, the second lower layer 1213 is a layer connected to the probe pin 20, and the second intermediate layer 1212 is a layer provided between the second upper layer 1211 and the second lower layer 1213. Herein, each through hole of the second upper layer 1211 may be formed at a position corresponding to the first connection pad 114 provided in the first lower layer 1113 of the first body 111; each through hole of the second intermediate layer 1212 may be formed in such a manner as to be located closer to the center than the through hole of the second upper layer 1211; and each through hole of the second lower layer 1213 may be formed in such a manner as to be located closer to the center than the through hole of the second intermediate layer 1212.

The through holes of each of the layers 1211, 1212, 1213 of the second body 121 are filled with a conductive material. Copper having high electrical conductivity may be used as the conductive material, by which the second via conductor 122 may be formed.

The conductive material may be printed on the bottom portion of the second upper layer 1211 and the second intermediate layer 1212 through a separate paste printing apparatus. Copper may be used as the conductive material, by which the second internal wiring layer 123 may be formed. The second internal wiring layer 123 connects each second via conductor 122 of each of the layers 1211, 1212, and 1213 to each other, and may be formed at a position corresponding to the second via conductor 122. However, the position of the second internal wiring layer 123 is not limited thereto. For example, the second internal wiring layer 123 may be formed on the top portions of the second intermediate layer 1212 and the second lower layer 1213.

In addition, the conductive material may be printed on the top portion of the second intermediate layer 1212 and the top portion and the bottom portion of the second lower layer 1213 through a paste printing apparatus. Copper may be used as the conductive material, by which the second connection pad 124 may be formed. Herein, the second connection pad 124 may be connected to the second internal wiring layer 123 or the probe pin 20.

In detail, the second connection pad 124 may be formed to have the same length as the second internal wiring layer 123 or may be formed to have a shorter length than the second internal wiring layer 123. In addition, when the layers 1211, 1212, and 1213 of the second body 121 are stacked, the centers of the second internal wiring layer 123 and the second connection pad 124 may be formed at the same position. Accordingly, when each layer 1211, 1212, and 1213 of the second body 121 is stacked, the second internal wiring layer 123 and the second connection pad 124 may be arranged to face each other at a predetermined interval.

A solder bump 125 of a protrusion shape is formed between the layers 1211, 1212, and 1213 of the second body 121. The solder bump 125 may be formed in a hemispherical shape through a paste printing apparatus for the purpose of bonding the layers 1211, 1212, and 1213 of the second body 121. Herein, the solder bump 125 may be formed after all of the second via conductor 122, the second internal wiring layer 123, and the second connection pad 124 are cured. Specifically, after the second via conductor 122, the second internal wiring layer 123, and the second connection pad 124 are heated and cured at 150° C. for one hour, the solder bumps 125 may be formed.

In detail, the solder bump 125 may be formed at one end of the second internal wiring layer 123. In the present embodiment, it is illustrated the solder bump 125 is formed on the bottom portion of the second upper layer 1211 and the second intermediate layer 1212 as an example, but the formation of the solder bump 125 is not limited thereto. For example, the solder bump 125 is formed on the second connection pad 124 formed on the top portion of the second intermediate layer 1212 and the second lower layer 1213, or formed on both the bottom portion of the second upper layer 1211 and the second intermediate layer 1212 and the top portion of the second intermediate layer 1212 and the second lower layer 1213.

When heat is applied to the solder bump 125 formed on the second internal wiring layer 123, the solder bump 125 having a low melting point is melted even at low heat. When the melting of the solder bumps 125 proceeds, the layers 1211, 1212, and 1213 of the second body 121 are stacked, and then a pressure is applied thereto. Accordingly, the molten solder bump 125 may harden in contact with the second via conductor 122 of the adjacent layer or the second internal wiring layer 123. That is, the second via conductor 122, the second internal wiring layer 123, and the second connection pad 124 provided in each of the layers 1211, 1212, and 1213 of the second body 121 may be connected through the solder bump 125.

A portion of the molten solder bump 125 may penetrate into the pore 121a of the second body 121. Specifically, the solder bump 125 may flow to the adjacent pore 121a while being melted. Accordingly, the solder bump 125 may harden to be fixed inside the pore 121a, as well as in the second via conductor 122 or the second internal wiring layer 123 adjacent to one end of the second via conductor 122 or the second internal wiring layer 123 that were previously formed. That is, the solder bump 125 is penetrated into the pore 121a and then hardens, so that the solder bump 125 may serve to fix the second via conductor 122 and the second internal wiring layer 123 on the second insulating portion 120.

The first insulating portion 110 and the second insulating portion 120, each of which is formed in an integral manner, may be coupled through the solder bump 125. In detail, a solder bump 125 may be formed at one end of the second via conductor 122 provided at the uppermost of the second insulating portion 120. When heat is applied to the solder bumps 125 so that the solder bumps 125 are melted, the first connection pad 114 formed at the lowermost of the first insulating portion 110 and the solder bump 125 formed at the most top of the second insulating portion 120 are in contact with each other, and may harden in contact with each other so that the first insulating portion 110 and the second insulating portion 120 may be combined to each other.

The PCB substrate and the probe pin 20 are coupled to one side and the other side of the first insulating portion 110 and the second insulating portion 120, respectively, by which the probe card 1 may be formed.

Hereinafter, the operation and effects of the probe card 1 according to a preferred embodiment of the present invention having the configuration as described above will be described.

First, the probe card 1 includes a multilayer ceramic substrate 10 having a first insulating portion 110 provided with a plurality of layers 1111, 1112, and 1113, and a second insulating portion 120 provided with a plurality of layers 1211, 1212, and 1213, and a probe pin 20 connected to the multilayer ceramic substrate 10. Herein, the probe pin 20 is attached to the second insulating portion 120.

The first insulating portion 110 includes a first body 111 of ceramic material. The first body 111 is composed of three layers, and each layer may be formed with a plurality of through holes by laser irradiation processing, punch processing, drill processing, or the like. Herein, a plurality of through holes on the uppermost layer may be formed at a greater distance than through holes of the lowermost layer.

Tungsten is filled with the through hole of the first body 111 to form a first via conductor 112, and tungsten is printed on one end and the other end of the first via conductor 112 so that the first internal wiring layer 113 or the first connection pad 114 may be formed. Herein, the uppermost first connection pad 114 is connected to the PCB substrate, and the lowermost first connection pad 114 is connected to the second insulating portion 120.

When the first via conductor 112, the first internal wiring layer 113, and the first connection pad 114 are cured, the respective layers of the first body 111 are stacked and placed under pressure, and baked for a predetermined time at a temperature of 1300 to 1500° C. Accordingly, the first via conductor 112, the first internal wiring layer 113, and the first connection pad 114 made of tungsten may be integrated together with the first body 111 made of ceramic material. That is, the first body 111, the first via conductor 112, the first internal wiring layer 113, and the first connection pad 114 may be formed in an integral manner.

In addition, the first insulating portion 110 is coupled to the second insulating portion 120. The second insulating portion 120 includes a second body 121 made of an anodic oxide film. The second body 121 may include three layers, and may include a pore 121a formed during the anodization and a through hole formed by etching. Herein, a plurality of through holes of the uppermost layer may be formed at a greater distance than through holes of the lowermost layer.

The through holes of the second body 121 are filled with copper to form the second via conductor 122, and copper is printed at one end and the other end of the second via conductor 122 so that the second internal wiring layer 123 or the second connection pad 124 may be formed. Herein, the lowermost second connection pad 124 is connected to the probe pin 20.

When the second via conductor 122, the second internal wiring layer 123, and the second connection pad 124 are dried, the solder bump 125 may be formed at one end of the second internal wiring layer. The solder bump 125 may be formed at the top or bottom of each layer of the second body 121, or both at the top and the bottom of the second body 121.

When heat is applied to the solder bumps 125, the melting of the solder bumps 125 proceeds. Herein, the second body 121 may be provided so that each layer is stacked and heated before the solder bump 125 hardens. Accordingly, the molten solder bump 125 may harden in contact with the adjacent second internal wiring layer 123 or the second connection pad 124. For example, when the solder bump 125 is formed on the bottom portion of the second upper layer 1211 of the second body 121, the molten solder bump 125 may harden in contact with the second connection pad 124 of the second intermediate layer 1212. That is, the second internal wiring layer 123 of the second upper layer 1211 and the second connection pad 124 of the second intermediate layer 1212 may be connected through the solder bump 125.

As described above, the multilayer ceramic substrate 10 is provided so that a plurality of layers is bonded through a solder bump 125 having a low melting point, and at the same time, includes a second body 121 of an anodized oxide material having a low thermal expansion coefficient to prevent thermal deformation.

In addition, a part of the molten solder bump 125 may penetrate into the pore 121a of the second body 121. Accordingly, the solder bump 125 may harden to be fixed while being anchored in the pore 121a. That is, the solder bump 125 serves to fix the second via conductor 122, the second internal wiring layer 123, and the second connection pad 124 on the second insulating portion 120, thereby securely fixing the second insulating portion 120 of the multilayer.

Specifically, the solder bump 125 electrically couples the second via conductor 122, the second internal wiring layer 123, and the second connection pad 124 to each other and is fixed to the inside of the pore 121a, thereby allowing each layer 1211, 1212, and 1213 to be mechanically coupled. That is, the second body 121 of the anodized oxide material including the pore 121a and the solder bump 125 may be coupled to each other, so that there is an advantage that electrical coupling and mechanical coupling of the second insulating portion 120 may be simultaneously performed.

In addition, the first insulating portion 110 having high rigidity is integrated with the second insulating portion 120 of the anodic oxide film having a low thermal expansion coefficient, whereby there is an effect that the overall rigidity of the multilayer ceramic substrate 10 may be increased.

Hereinafter, a probe card according to other embodiment of the present invention will be described with reference to FIGS. 4 and 5. However, since the other embodiments have a difference from the one embodiment in that a blocking unit 126' is further provided, the following description focuses on the difference and the description and reference numerals of the one embodiment for the same parts are used.

Figure 4:
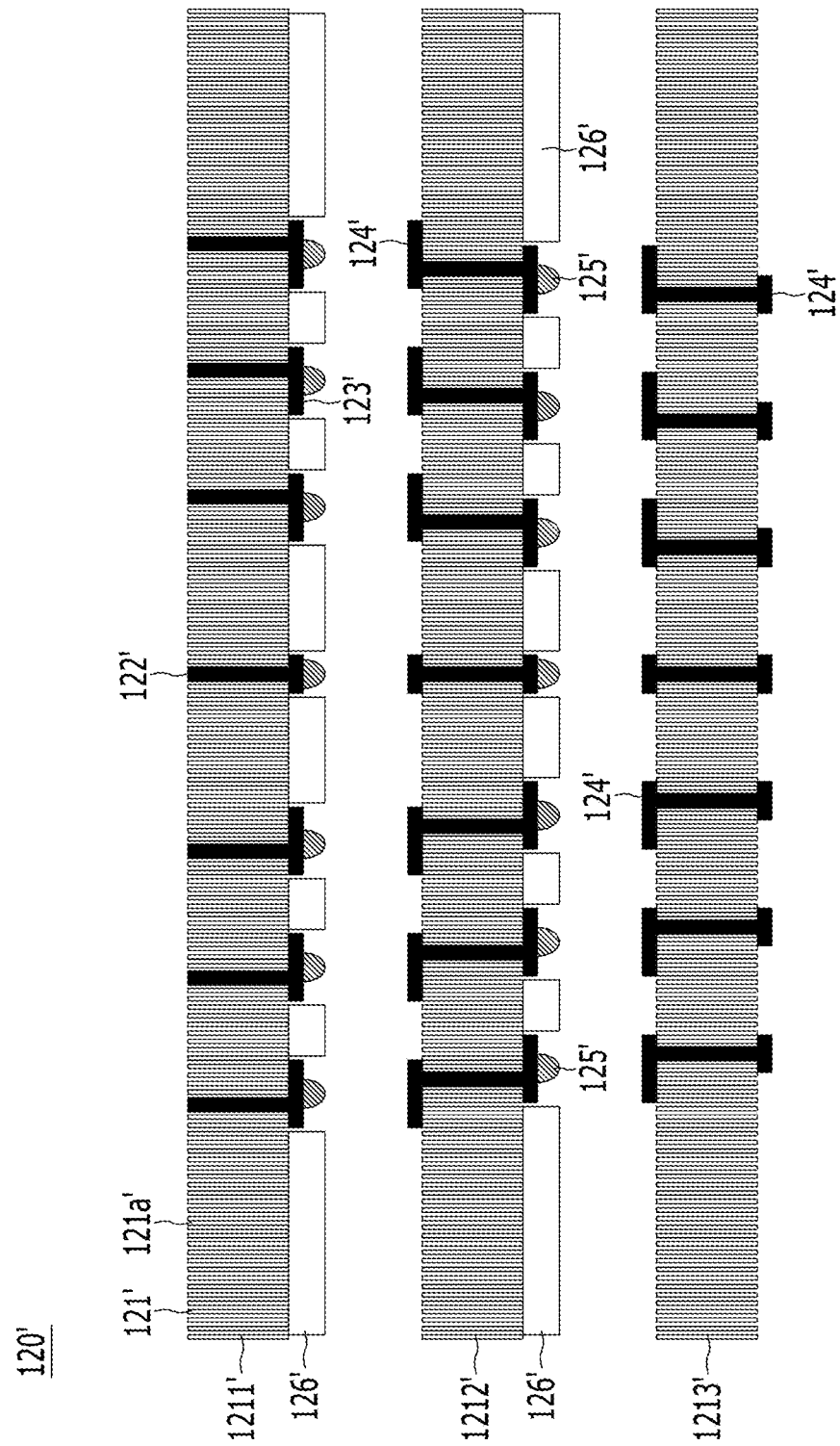
FIG. 4 is a view illustrating a second insulating portion of a probe card according to other embodiment of the present invention.
Figure 5:
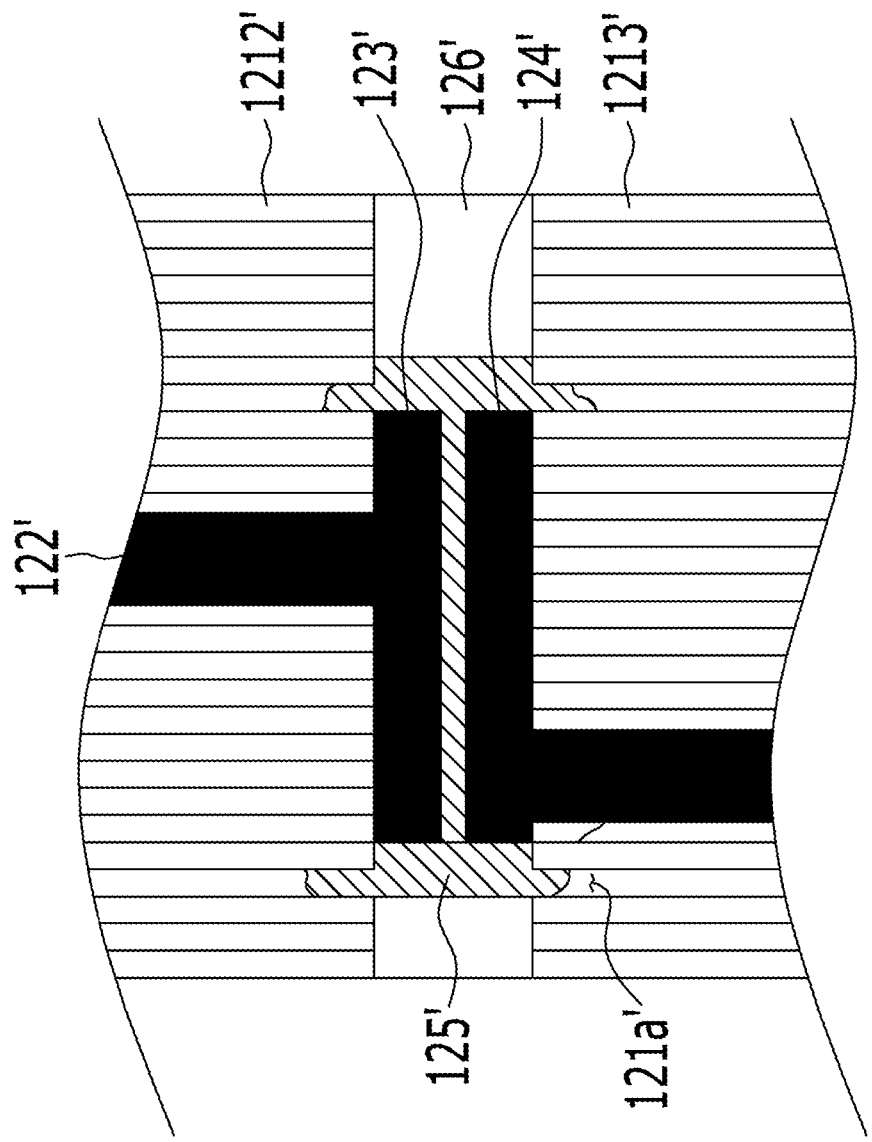
FIG. 5 is an enlarged view illustrating a portion of the configuration of FIG. 4.

FIG. 4 is a view illustrating a second insulating portion of a probe card according to other embodiment of the present invention, and FIG. 5 is an enlarged view illustrating a portion of the configuration of FIG. 4.

Referring to FIGS. 4 and 5, the second insulating portion 120' of the probe card according to other embodiment of the present invention includes a blocking portion 126' on one side in which layers of the second body 121' are overlapped with each other. In detail, the blocking portion 126' may be provided at both sides of a solder bump 125'.

The blocking portion 126' is made of an insulating material, and may be implemented as an insulating film made of a synthetic resin material including polyimide. Herein, when the second body 121' is bonded using a liquid bonding body, the bonding is performed in a state of interposing a bonding film made of a synthetic resin material in order to improve the bonding strength. As the blocking portion 126' is made of an insulating material, the blocking portion 126' may electrically insulate the second body 121' provided at the top and bottom portions.

When the solder bump 125' melts and then flows, the solder bump 125' may harden while filling the space between the blocking portions 126' formed at both sides. Accordingly, when the solder bump 125' melts and flows, the solder bump 125' may be prevented from flowing to the second via conductor 122' and the second connection pad 123', other than the second via conductor 122' and the second connection pad 123' adjacent thereto.

The blocking portion 126' may be provided between the second upper layer 1211' and the second intermediate layer 1212' and between the second intermediate layer 1212' and the second lower layer 1213'. Accordingly, when the second upper layer 1211', the second intermediate layer 1212', and the second lower layer 1213' are disposed to be in contact with each other, the blocking portion 126' may serve to bond other layers of the second body 121', which are adjacent to the top or bottom portion thereof. That is, the blocking portion 126' prevents the solder bump 125' from flowing to the second via conductor 122' and the second internal wiring layer 123' which are not adjacent thereto, and makes it easy to bond each layer of the second body 121'.

Herein, the melting temperature of the blocking portion 126' may be higher than the melting temperature of the solder bump 125'. Specifically, the melting temperature of the solder bump 125' may be about 150° C. to 300° C., and the melting temperature of the blocking portion 126' may be equal to or higher than 300° C. Accordingly, when the second insulating portion 120' is heated to a temperature of less than 300° C., the blocking portion 126' is not yet melted, and only the solder bump 125' is melted and thus flows to a gap between the blocking portions 126'.

After the solder bump 125' is melted, the second insulating portion 120' may be heated to a temperature higher than the melting temperature of the solder bump 125'. Accordingly, the blocking portion 126' may be bonded to the layer of the second body 121', which is adjacent. That is, after the solder bump 125' is melted, the blocking portion 126' and the layer of the second body 121' may be bonded to each other.

When the blocking portion 126' is thermally compressed, a portion of the molten blocking portion 126' may penetrate into the pore 121a' formed in the second body 121'. Accordingly, the blocking portion 126' bonded to one side of the second body 121' may exert an anchoring effect in which the blocking portion 126' is securely fixed on the second body 121'. As a result, the layers of the second body 121' provided on the top and bottom of the blocking portion 126' can be more securely bonded to each other.

In addition, the solder bump 125' that overflows into the spaced space to be fused between the second connection pad 124' and the blocking portion 126' is also penetrated into the pore 121a' formed in the second body 121', thereby enabling an anchoring effect. The anchoring effect of the solder bump 125' allows the upper and lower layers of the second body 121' to be more securely bonded.

Although the multilayer ceramic substrate and the probe card including the same according to the present invention have been described as specific embodiments, these are only examples, and the present invention is not limited thereto, but is interpreted as having the broadest concept according to the basic idea disclosed herein. Those skilled in the art can combine and substitute the disclosed embodiments to implement a pattern of a shape that is not indicated, but this is also within the scope of the present invention. In addition, those skilled in the art can easily change or modify the disclosed embodiments based on the present specification, and it is apparent that such changes or modifications belong to the scope of the present invention.

The invention claimed is:

1. A multilayer ceramic substrate, comprising:
a first insulating portion including a body of a ceramic material, a first via conductor penetrating through the body of the ceramic material, and a first internal wiring layer and a first connection pad connected to the first via conductor; and
a second insulating portion including a body of an anodized oxide material, a second via conductor penetrating through the body of the anodized oxide material, and a second internal wiring layer and a second connection pad connected to the second via conductor,
wherein the second insulating portion further includes a solder bump at one end of each of the second internal wiring layer and the second connection pad provided in a plurality of layers, and wherein the second via conductor, the second internal wiring layer, and the second connection pad are electrically connected to each other through the solder bump.

2. The substrate of claim 1, wherein the first via conductor, the first internal wiring layer, and the first connection pad are provided in tungsten; and the second via conductor, the second internal wiring layer, and the second connection pad are provided in copper.

3. The substrate of claim 1, wherein the second insulating portion includes a plurality of pores formed during anodization, and a portion of the solder bump is melted to be penetrated into the plurality of pores and then hardens to fix the second via conductor, the second internal wiring layer, and the second connection pad on the second insulating portion.

4. The substrate of claim 1, wherein the second insulating portion further includes a blocking portion on one side in which the plurality of layers are overlapped with each other; and the blocking portion is provided at both sides of the solder bump.

5. The substrate of claim 4, wherein the blocking portion is provided as an adhesive insulating material.

6. A multilayer structure, comprising:

an insulating portion including a body of an anodized oxide material, a via conductor penetrating through the body, and an internal wiring layer and a connection pad connected to the via conductor, wherein the insulating portion further includes a solder bump at one end of each of the internal wiring layer and the connection pad provided in a plurality of layers, and wherein the via conductor, the internal wiring layer, and the connection pad are electrically connected to each other through the solder bump.

* * * * *